(12) United States Patent
Fujimura et al.

(10) Patent No.: US 11,361,924 B2
(45) Date of Patent: Jun. 14, 2022

(54) RELAY UNIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yuki Fujimura, Mie (JP); Hitoshi Takeda, Mie (JP); Ken Furusawa, Mie (JP); Ryoya Okamoto, Mie (JP); Hiroshi Shimizu, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 196 days.

(21) Appl. No.: 16/612,080

(22) PCT Filed: May 16, 2018

(86) PCT No.: PCT/JP2018/018854
§ 371 (c)(1),
(2) Date: Nov. 8, 2019

(87) PCT Pub. No.: WO2018/225470
PCT Pub. Date: Dec. 13, 2018

(65) Prior Publication Data
US 2020/0168419 A1    May 28, 2020

(30) Foreign Application Priority Data
Jun. 5, 2017   (JP) .............................. JP2017-110576

(51) Int. Cl.
*H01H 9/00*    (2006.01)
*H01H 50/12*   (2006.01)
(Continued)

(52) U.S. Cl.
CPC ............ *H01H 50/12* (2013.01); *H01H 50/04* (2013.01); *H01H 50/14* (2013.01); *H01H 89/00* (2013.01); *H01H 2050/049* (2013.01)

(58) Field of Classification Search
CPC ........ H01H 50/12; H01H 50/04; H01H 50/14; H01H 89/00; H01H 2050/049;
(Continued)

(56) References Cited

U.S. PATENT DOCUMENTS

2008/0118819 A1*  5/2008  Gamboa ............. H01M 10/482
                                                              429/61
2011/0215890 A1*  9/2011  Abolhassani ......... H01F 27/025
                                                              336/60
(Continued)

FOREIGN PATENT DOCUMENTS

JP    2001-298290    10/2001
JP    2004-134140     4/2004
(Continued)

OTHER PUBLICATIONS

Official Communication issued in International Bureau of WIPO Patent Application No. PCT/JP2018/018854, dated Aug. 21, 2018.

*Primary Examiner* — Shawki S Ismail
*Assistant Examiner* — Lisa N Homza
(74) *Attorney, Agent, or Firm* — Greenblum & Bernstein, P.L.C.

(57) ABSTRACT

A relay unit includes: bus bars serving as conductive paths; relays including contact portions for turning on and off energization of the bus bars, and a plurality of terminals connected to the contact portions, the bus bars being fixed to
(Continued)

the terminals; and heat dissipation members that are fixed to the terminals of the relays, receive heat of the terminals, and dissipate the heat.

7 Claims, 19 Drawing Sheets

(51) Int. Cl.
  *H01H 50/04* (2006.01)
  *H01H 50/14* (2006.01)
  *H01H 89/00* (2006.01)
(58) Field of Classification Search
  CPC .... H01H 85/0418; H01H 50/54; B60R 16/02; H05K 7/20
  USPC .......................................................... 335/1
  See application file for complete search history.

(56) References Cited

U.S. PATENT DOCUMENTS

| | | | | |
|---|---|---|---|---|
| 2012/0019061 | A1* | 1/2012 | Nishihara | H01M 10/441 307/10.1 |
| 2012/0161677 | A1* | 6/2012 | Kunimitsu | H01M 10/482 318/139 |
| 2013/0149571 | A1* | 6/2013 | Lee | B60L 50/64 429/61 |
| 2014/0203675 | A1* | 7/2014 | Maeda | H02K 9/06 310/59 |
| 2015/0003015 | A1* | 1/2015 | Kulkarni | H05K 7/202 361/700 |
| 2015/0015350 | A1* | 1/2015 | Tachikawa | H01H 50/18 335/131 |
| 2015/0037616 | A1* | 2/2015 | Wyatt | H01M 50/20 429/7 |
| 2015/0037642 | A1* | 2/2015 | Pinon | H01M 10/4257 429/99 |
| 2015/0037646 | A1* | 2/2015 | Wyatt | H01M 10/6555 429/120 |
| 2015/0037649 | A1* | 2/2015 | Wyatt | H01M 10/655 429/120 |
| 2015/0069829 | A1* | 3/2015 | Dulle | B60L 50/61 307/9.1 |
| 2016/0190898 | A1* | 6/2016 | Yamashita | H02K 11/21 310/68 B |
| 2016/0193694 | A1* | 7/2016 | Dinkelman | H01M 50/502 429/178 |
| 2016/0254732 | A1* | 9/2016 | Kojima | H02K 11/33 310/68 R |
| 2016/0276720 | A1* | 9/2016 | Steil | H01M 10/6557 |
| 2016/0351479 | A1* | 12/2016 | Okanoue | H02M 7/003 |
| 2020/0083502 | A1* | 3/2020 | Fan | H01M 50/342 |

FOREIGN PATENT DOCUMENTS

| | | |
|---|---|---|
| JP | 2005-312254 | 11/2005 |
| JP | 2012-165567 | 8/2012 |
| JP | 2014-079093 | 5/2014 |
| JP | 2016-201289 | 12/2016 |
| JP | 2017-011235 | 1/2017 |

* cited by examiner

RELAY UNIT

TECHNICAL FIELD

Disclosed herein is a technique for dissipating heat from a relay.

BACKGROUND ART

Conventionally, a technique for dissipating heat generated by energization of a relay to the outside has been known. In the electronic unit box disclosed in Patent Document 1, relays are disposed on the flat plate portion of a heat dissipation plate. The terminals of the relays that have penetrated the through holes of the flat plate portion are soldered to the connection portion of the flexible printed circuit, and are electrically connected to the control substrate through the flexible printed substrate.

CITATION LIST

Patent Documents

Patent Document 1 JP 2001-298290A (FIG. 4)

SUMMARY OF INVENTION

Technical Problem

When the relays are energized, it is preferable that the heat of the terminals can be dissipated to the outside efficiently, because the portions of the terminals in the relays become hotter than the exterior. However, in the configuration disclosed in Patent Document 1, although the exterior of each relay is in contact with the heat dissipation plate, the terminal is inserted into the through hole of the heat dissipation plate with a gap. Accordingly, there has been a problem in that the heat of the terminals of the relays is not easily transmitted to the heat dissipation plate, and the dissipation of the heat of the relays is not sufficient.

The technique described in the present specification has been completed based on the above-mentioned circumstances, and it is an object of the present invention to improve dissipation of heat of a relay.

Solution to Problem

A relay unit described in the present specification includes: bus bars serving as conductive paths; a relay including a contact portion for turning on and off energization of the bus bars and a plurality of terminals connected to the contact portion, the bus bars being fixed to the plurality of terminals; and a heat dissipation member that is fixed to a terminal among the plurality of terminals of the relay, receives heat of the terminal, and dissipates the heat.

With this configuration, because the heat dissipation member is fixed to the terminal of the relay, the heat dissipation member can receive the heat of the terminal and dissipate the heat to the outside. This makes it possible to improve the heat dissipation of the heat of the relay.

The following aspects are preferable as embodiments of the technique described in this specification.

The relay unit may include: a plurality of the relays; a plurality of the heat dissipation members; and a fan, wherein the plurality of heat dissipation members are disposed in the air flow path of the fan.

In this way, the heat dissipation of the heat dissipation members can be promoted by the air blowing from the fan.

The heat dissipation member may overlap a bus bar, and the heat dissipation member may be disposed on the side opposite to the relay with respect to the bus bar.

In this manner, the degree of freedom of the shape of the heat dissipation member can be increased as compared with the configuration in which the heat dissipation member is disposed on the relay side with respect to the bus bar. Accordingly, it is easy to improve heat dissipation by the shape of the heat dissipation member.

The relay unit may further include a fuse disposed in the conductive path, and a partition wall partitioning the heat dissipation member and the fuse.

With this configuration, transfer of heat from the heat dissipation member to the fuse is suppressed by the partition wall. Accordingly, it is possible to suppress the influence that the heat from the heat dissipation member has on the operation of the fuse.

The relay unit may include a plurality of the relays, a plurality of the heat dissipation members, a fan, and a base member on which the plurality of relays are mounted, wherein a ventilation hole is formed through a bottom plate portion of the base member on which the fan is disposed.

With this configuration, when the air passes through the ventilation hole when the fan blows, the cooling efficiency of the heat dissipation members can be enhanced.

The fan may be disposed so as to be able to blow air in a direction along the bottom plate portion, and the plurality of heat dissipation members are disposed in the air flow paths on both sides of the fan.

In this manner, the heat of the heat dissipation members can be dissipated efficiently by the fan.

The fan is disposed to be able to blow air in a direction orthogonal to the bottom plate portion.

In this manner, the air blown by the fan can easily pass through the through hole of the base member, and therefore the cooling efficiency of the heat dissipation member can be enhanced.

Advantageous Effects of Invention

According to the technique described herein, the dissipation of the heat of the relay can be improved.

DESCRIPTION OF EMBODIMENTS

First Embodiment

A first embodiment will be described with reference to FIGS. 1 to 11.

A relay unit 10 of the present embodiment is mounted in a vehicle such as an electric car or a hybrid car, for example, and is disposed in a power supply path from a power source such as a battery to a load such as a motor. Hereinafter, the X direction and the Y direction in FIG. 1 will be described as frontward and leftward respectively. Also, the Z direction in FIG. 2 will be described as upward.

Relay Unit 10

The relay unit 10 includes: a pair of relays 11A and 11B; a plurality of bus bars 20A to 20D serving as conductive paths; a plurality of heat dissipation members 30A and 30B fixed to the respective relays 11A and 11B to dissipate heat of the relays 11A and 11B; a fan 35 that blows air to the plurality of heat dissipation members 30A and 30B; and a base member 40 on which the bus bars 20A to 20D, the relays 11A and 11B, the heat dissipation members 30A and 30B, and the fan 35 are mounted.

Relays 11A and 11B

The relays 11A and 11B are, for example, mechanical relays to which a relatively large current such as a drive current of a car is supplied. The relays 11A and 11B are composed of a first relay 11A disposed on the left end side of the base member 40, and a second relay 11B that is disposed on the right end side of the base member 40 and is connected in series to the first relay 11A via a circuit on the power source and load side.

Figure 8:
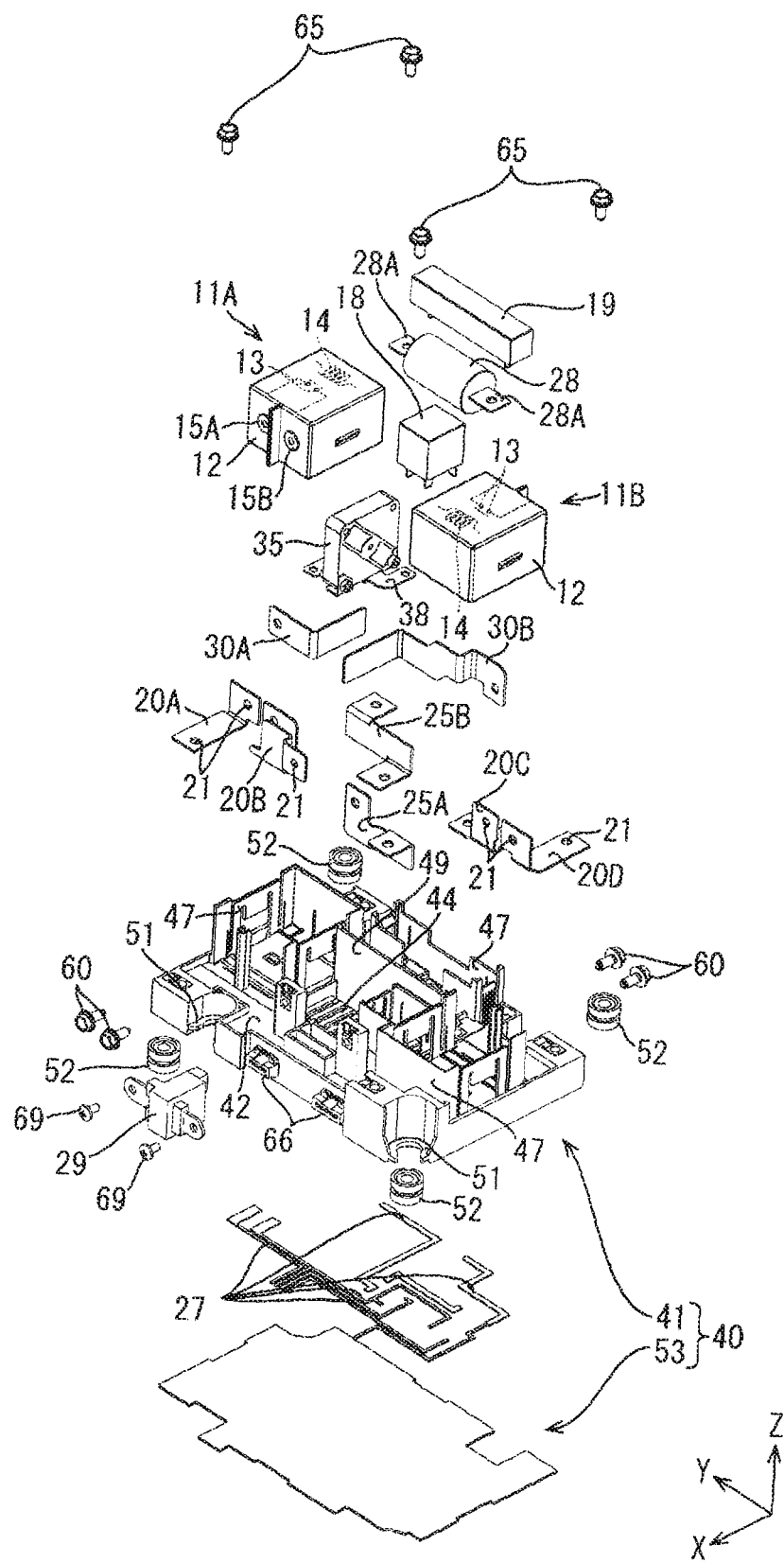
FIG. 8 is an exploded perspective view of the relay unit.

As shown in FIG. 8, the relays 11A and 11B each include, in a box-shaped resin case 12: a contact portion 13 for turning on and off the energization of the bus bars 20A to 20D; a coil portion 14 for opening and closing the contact portion 13; a pair (a plurality) of terminals 15A and 15B connected to the contact portion 13; and a pair of control terminals 16 (FIG. 2) connected to the coil portion 14.

Figure 3:
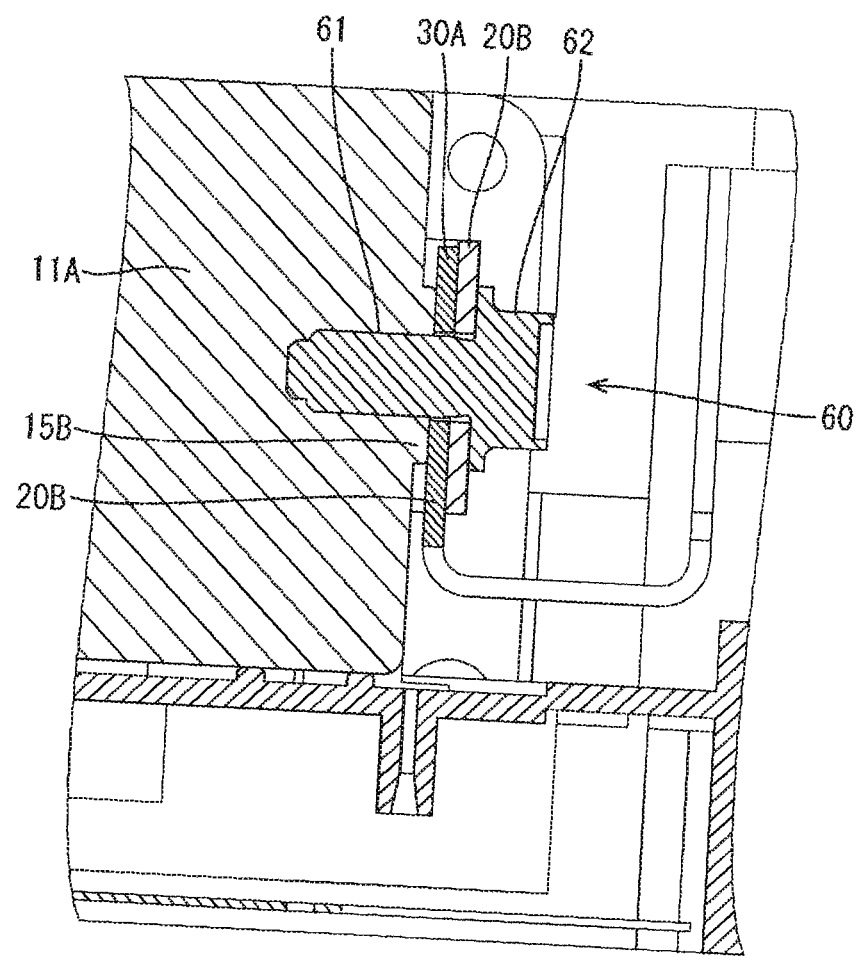
FIG. 3 is a cross-sectional view taken along line B-B of FIG. 1.
Figure 6:
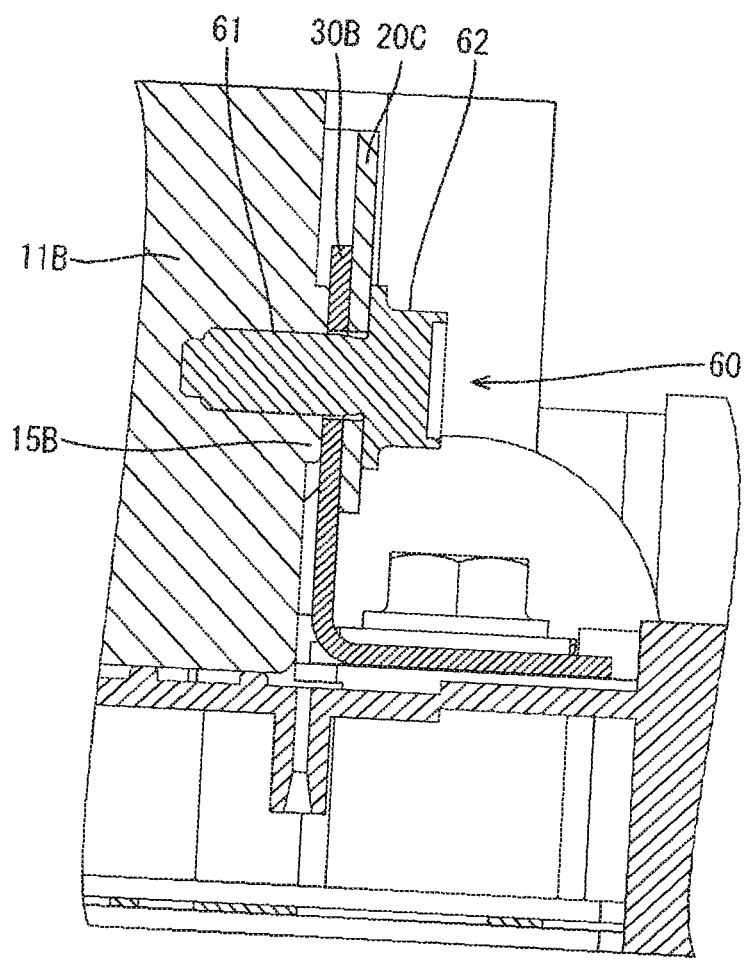
FIG. 6 is a cross-sectional view taken along line E-E of FIG. 1.

As shown in FIGS. 3 and 6, the terminals 15A and 15B are each in the shape of a nut to be fastened by a bolt 60 serving as a fastening member. The bolt 60 has a shaft portion 61 and a head portion 62. When the bolt 60 is fastened to the terminal 15B, the bus bar 20B (20C) and the heat dissipation member 30A (30B) are held between the terminal 15B and the head portion 62.

Figure 7:
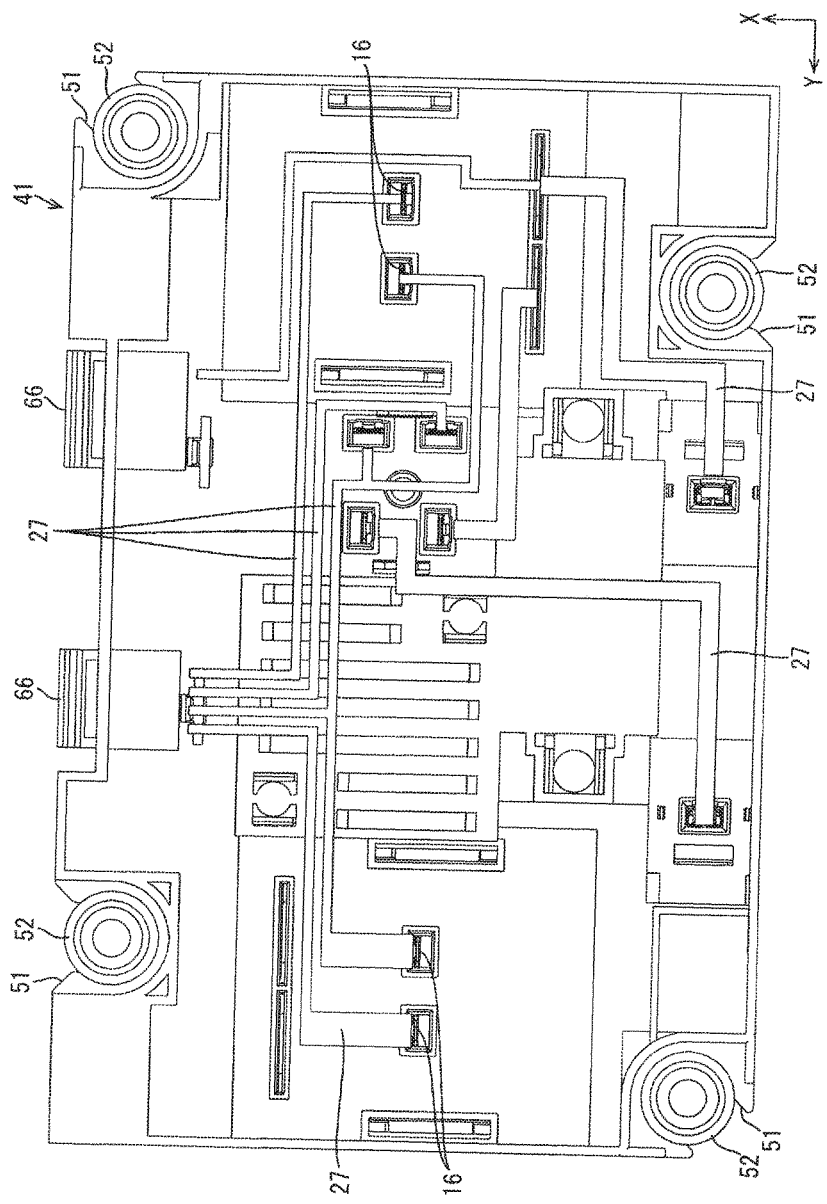
FIG. 7 is a diagram showing a state in which a control bus bar is arranged on the back surface side of a main body of a base member.

As shown in FIG. 7, each control terminal 16 is connected to an external ECU (Electronic Control Unit) (not shown) via a control connector 66 and a control bus bar 27 routed on the back surface of the base member 40. The energization of the coil portion 14 is controlled according to a control signal from the ECU, and the contact portion 13 is switched on and off.

Bus Bars 20A to 20D

The bus bars 20A to 20D are plates made of metal such as copper, a copper alloy, aluminum, or an aluminum alloy. The bus bars 20A to 20D are bent according to the wiring path and are connected to the pair of terminals 15A and 15B of the relays 11A and 11B, respectively. As shown in FIG. 8, through holes 21 through which the shaft portions 61 of the bolts 60 can be inserted are formed at both ends of the bus bars 20A to 20D.

Figure 1:
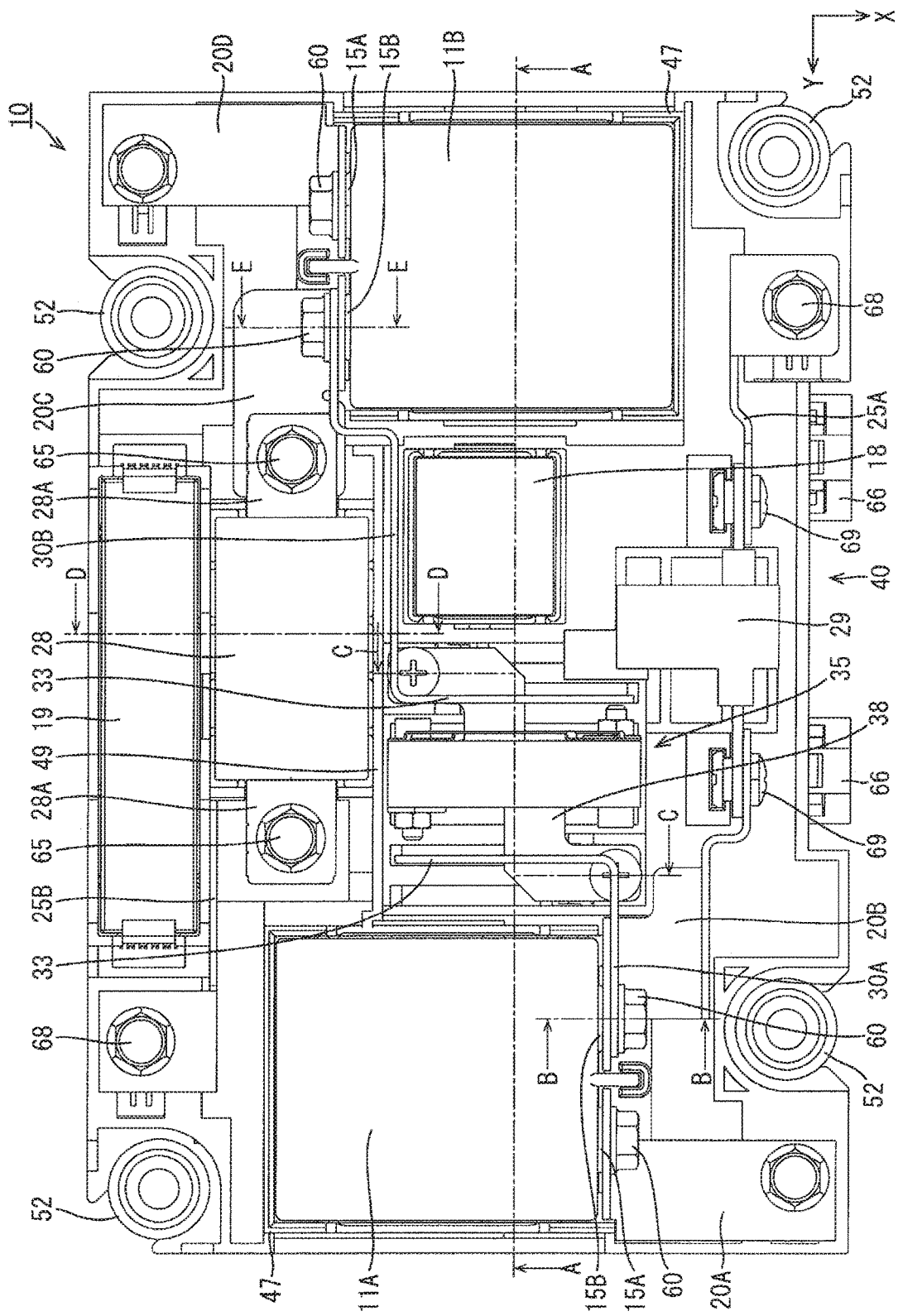
FIG. 1 is a plan view showing a relay unit of a first embodiment.

As shown in FIG. 1, the bus bar 20B that is connected to one terminal 15B of the relay 11A is connected to one end of an external connection bus bar 25A via a current sensor 29. The current sensor 29 outputs a signal from a Hall element to the external ECU or the like through a control bus bar 27. For example, a device in which a Hall element is disposed in a gap portion of a magnetic core can be used as the current sensor 29.

The bus bar 20C that is connected to one terminal 15B of the relay 11B is connected to one end of an external connection bus bar 25B via a fuse 28. The fuse 28 is provided with a fusing portion inside a cylindrical member. Two ends of the cylindrical member are fuse terminals 28A that are electrically connected to the fusing portion, and the bus bars 20A to 20D are connected to the fuse terminals 28A. Each of the other end sides of the external connection bus bars 25A and 25B is screwed to a terminal (not shown) of a terminal portion of an external electric wire with a screw 68, and is electrically connected to the load via the electric wire. The terminals of the fuse 28 are screwed with screws 65 to the base member 40 together with the bus bar 20C and the external connection bus bar 25B. The terminals of the current sensor 29 are bolted with bolts 69 to nuts fixed to the base member 40 together with the bus bar 20B and the external connection bus bar 25A.

One end of the bus bar 20A is connected to the other terminal 15A of the relay 11A, and the other end thereof is connected to the terminal of the terminal portion of an external electric wire, and is electrically connected to the negative electrode side of the power source via this electric wire. One end of the bus bar 20D is connected to the other terminal 15A of the relay 11B, and the other end thereof is connected to the terminal of the terminal portion of an electric wire, and is electrically connected to the positive electrode side of the power source via this electric wire.

Heat Dissipation Members 30A and 30B

Figure 9:
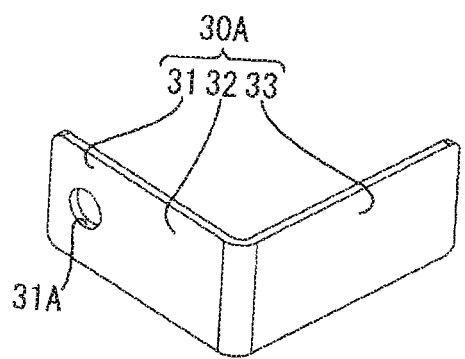
FIG. 9 is a perspective view showing one heat dissipation member.
Figure 10:
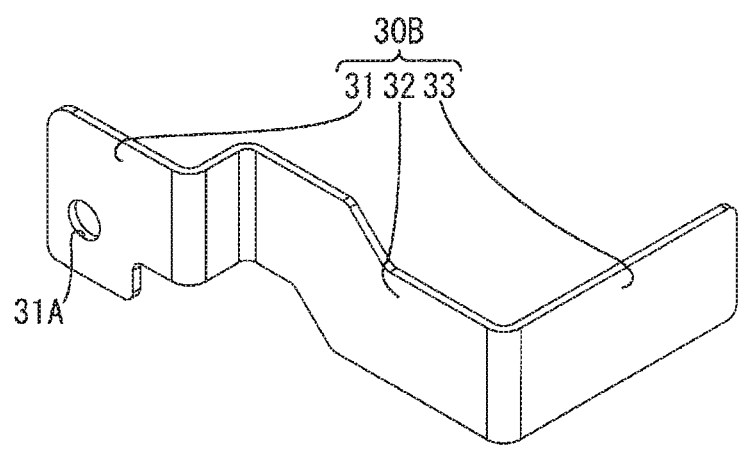
FIG. 10 is a perspective view showing another heat dissipation member

The heat dissipation members 30A and 30B are made of a member such as metal having high thermal conductivity such as copper, a copper alloy, aluminum, an aluminum alloy, or the like, and are flat as shown in FIGS. 9 and 10. The heat dissipation members 30A and 30B include: terminal connection portions 31 connected to the terminals 15B of the relays 11A and 11B; receiving portions 33 that are disposed to face the fan 35 and receive air from the fan 35; and connection portions 32 connecting the terminal connection portions 31 and the receiving portions 33.

A through hole 31A, through which the shaft portion 61 of the bolt 60 serving as a fastening member is inserted, is formed through each terminal connection portion 31. A portion between the terminal connection portion 31 and the receiving portion 33 is bent in accordance with a path from the terminal 15B to the position where the air from the fan 35 is received. In both of the heat dissipation members 30A and 30B, the plate surface of the terminal connection portion 31 and the plate surface of the receiving portion 33 extend in directions orthogonal to each other. Each receiving portion 33 is disposed on the air flow path (air flow path A1 in FIG. 2) of the fan 35 in a direction in which the plate surface is perpendicular to the air flow direction.

Fan 35

Figure 11:
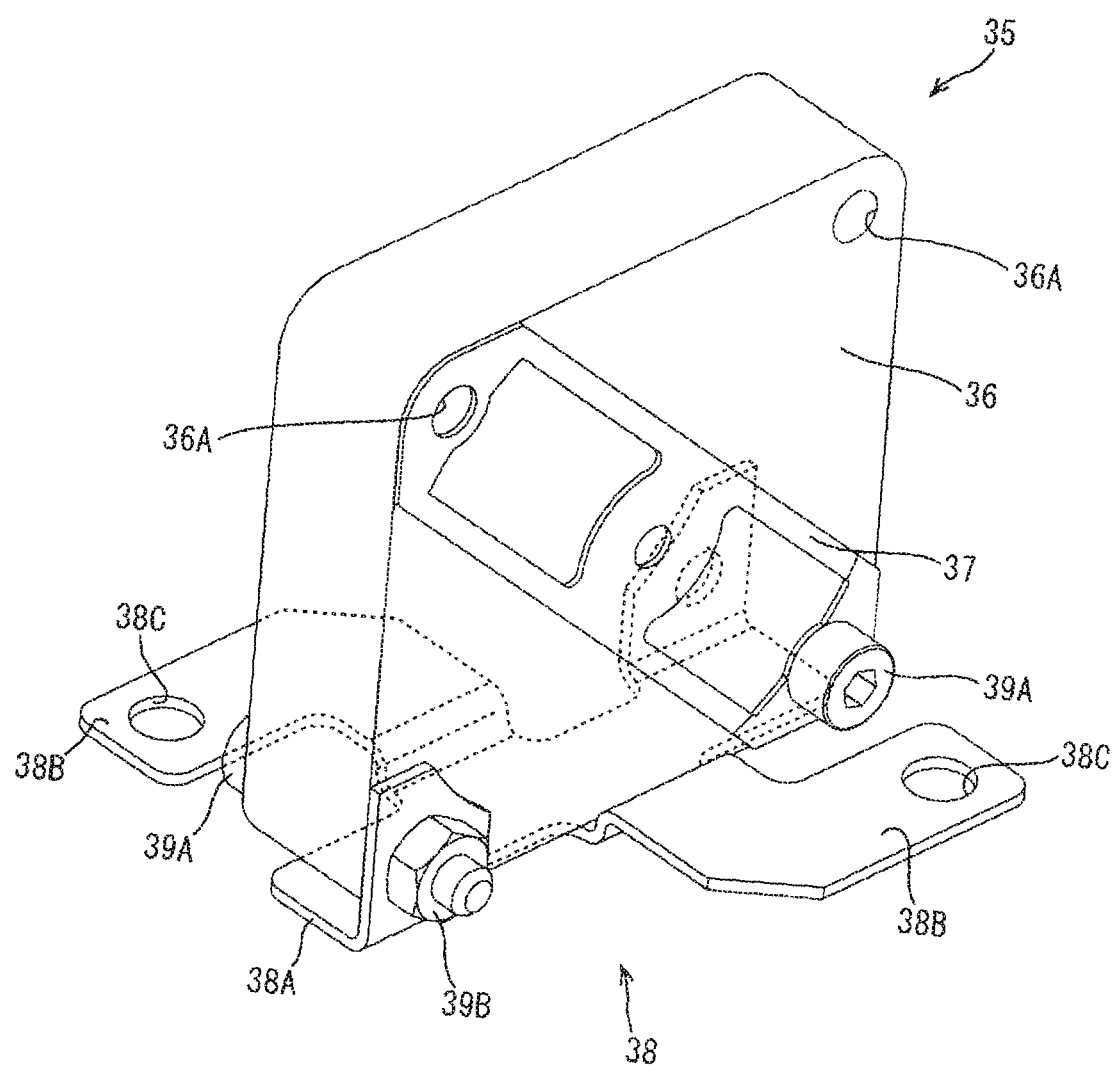
FIG. 11 is a perspective view showing a fan.

As shown in FIG. 11, the fan 35 is provided with a rotating blade (not shown) that rotates in a fan case 36. On the left and right sides of the fan case 36, a large number of slit-like vents (not shown) through which air passes are opened. The fan case 36 is a rectangular solid having that is thin in the left-right direction, and the air that passes through the vents is blown from one side surface to the other side surface. Fixing holes 36A through which the fan 35 is fixed are formed at positions of four corners on both side surfaces. A metal frame 37 is attached to the side surface of the fan case 36.

A metal fixing member 38 for fixing the fan 35 to the base member 40 is attached to the bottom surface of the fan 35. The fixing member 38 is fastened and fixed to the fixing holes 36A on the lower end side of the fan case 36 with bolts 39A and nuts 39B. The fixing member 38 includes: a flat seat portion 38A on which the bottom portion of the fan 35 is placed; and a pair of extending portions 38B that extend in a crank shape from the side edges of the seat portion 38A to the left and right. The seat portion 38A is disposed slightly downward with respect to the pair of extending portions 38B. In each extending portion 38B, a fastening hole 38C for fastening and fixing the fan 35 to the base member 40 with a bolt 63 is formed.

Base Member 40

The base member 40 is made of synthetic resin, and includes a main body 41 and a cover 53 for closing the back surface side of the main body 41 as shown in FIG. 8. The main body 41 includes: a bottom plate portion 42 on which electronic components such as the relays 11A and 11B and the fan 35 are mounted; surrounding walls 47 that stand upright from the bottom plate portion 42 and surround each electronic component individually; and a partition wall 49 that stands upright from the bottom plate portion 42 and partitions the heat dissipation members 30A and 30B and the fuse 28 from each other.

Figure 2:
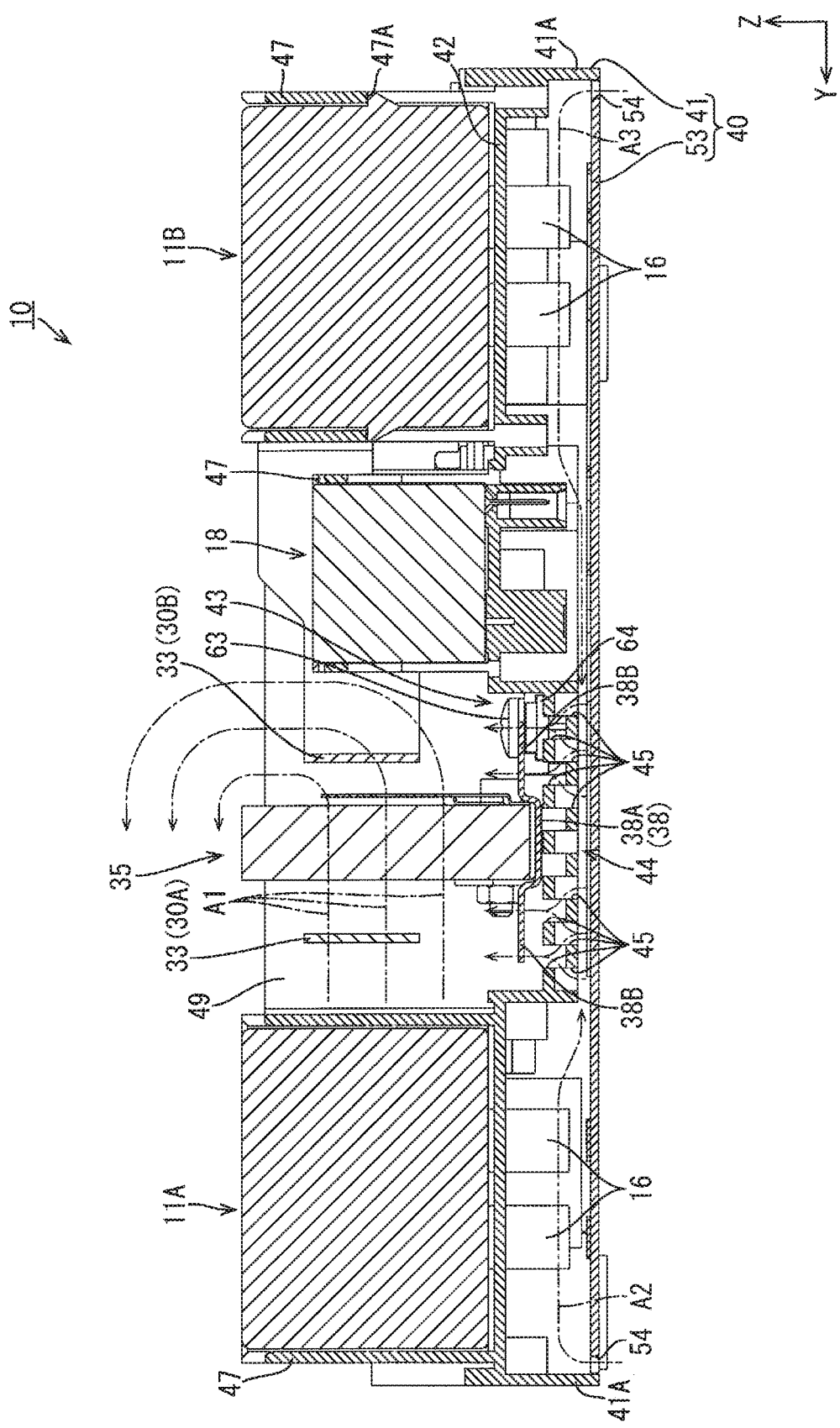
FIG. 2 is a cross-sectional view taken along line A-A of FIG. 1.
Figure 4:
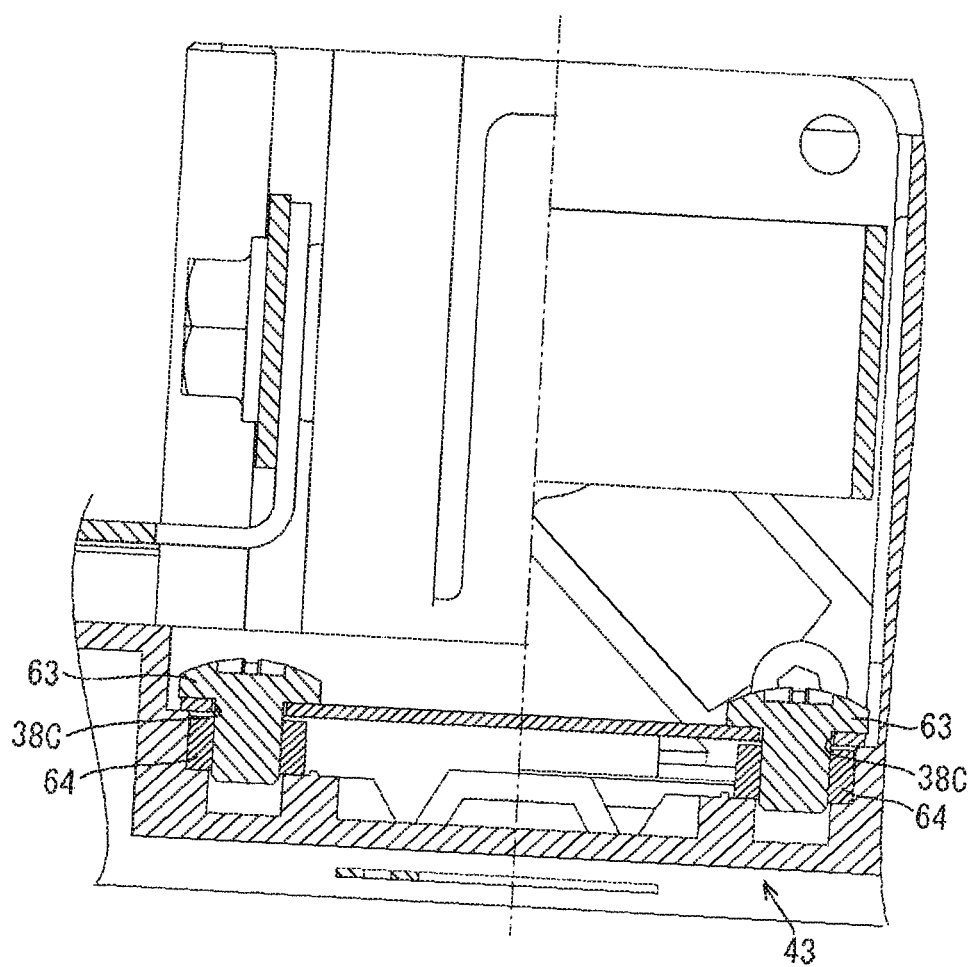
FIG. 4 is a cross-sectional view taken along line C-C of FIG. 1.

As shown in FIGS. 2 and 4, the bottom plate portion 42 is provided with a fan mounting portion 43 on which the fan 35 is mounted, at a position between the pair of relays 11A and 11B. A pair of nuts 64 is fixed to the fan mounting portion 43 at diagonal positions, and the fixing members 38 of the fan 35 are attached thereto. The fixing member 38 is fixed to the fan mounting portion 43 by fastening the bolts 63 and the nuts 64. The bottom plate portion 42 below the fan 35 is provided with a plate-shaped ventilation plate portion 44 with two upper and lower stages. The ventilation plate portion 44 has slit-shaped ventilation holes 45 in each stage, and a crank-shaped air passage is formed due to the positions in the left-right direction of the ventilation holes 45 in each stage being shifted.

Each surrounding wall 47 has a rectangular shape in which electronic components such as the relays 11A and 11B, the fuse 28, a precharge relay 18, and a precharge resistor 19 can be fitted. The surrounding wall 47 is provided with a locking portion 47A for locking the electronic component to prevent the electronic component from coming off. The precharge relay 18 and the precharge resistor 19 are connected in series to each other, and in parallel to the relay 11A. The precharge relay 18 and the precharge resistor 19 prevent seizure of the contact portion 13 due to the large current flowing in the relays 11A and 11B.

Figure 5:
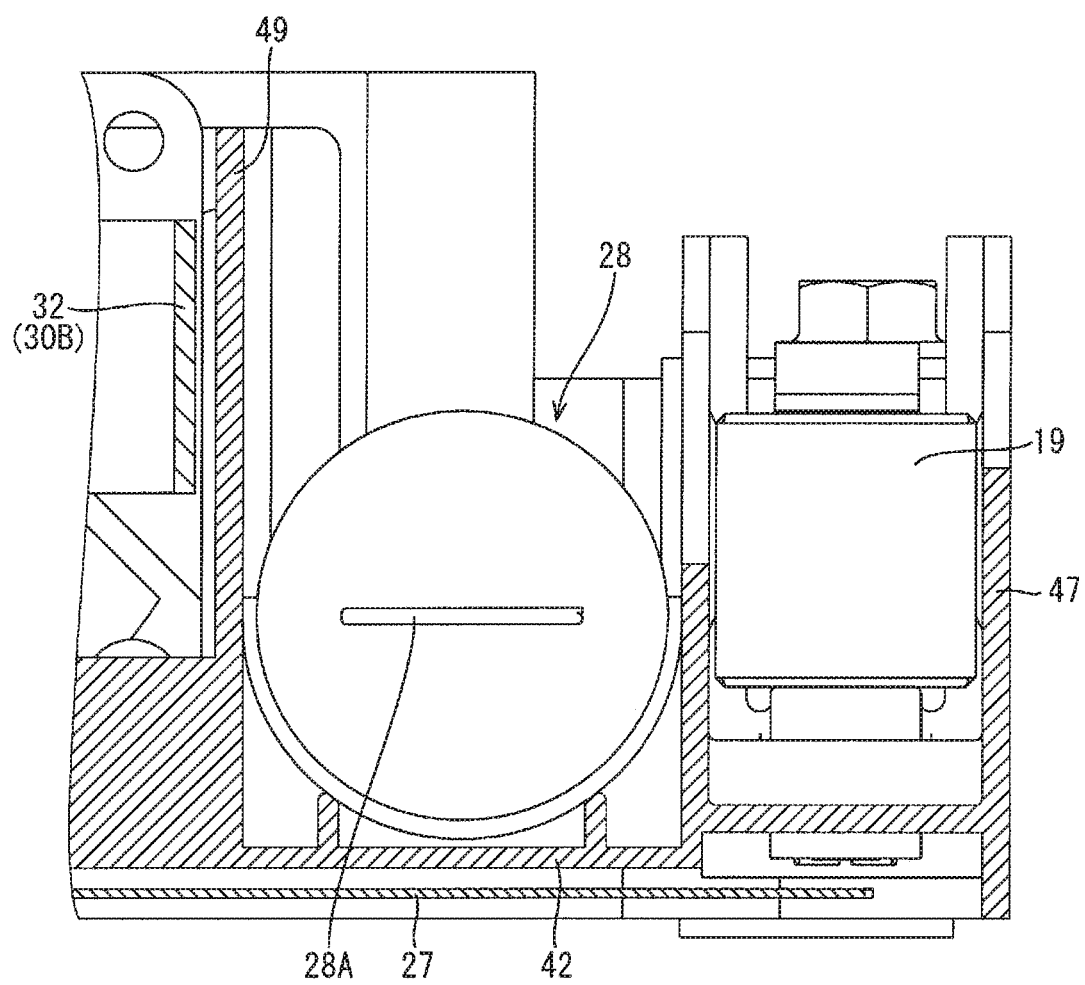
FIG. 5 is a cross-sectional view taken along line D-D of FIG. 1.

The partition wall 49 is provided to couple the side walls of the surrounding walls 47 surrounding the left and right relays 11A and 11B without a gap, and is formed in a range that entirely partitions the heat dissipation members 30A and 30B and the fuse 28 from each other. As shown in FIG. 5, the height of the partition wall 49 is such that the upper end of the partition wall 49 is disposed above the upper end of the receiving portion 33.

As shown in FIG. 2, an air passage 54 through which air passes is formed between the peripheral wall 41A of the main body 41 and the peripheral edge of the cover 53. As the fan 35 is driven, air passes through the air passage 54, and is guided to the ventilation plate portion 44 through the paths (A2 and A3 in FIG. 2) between the bottom plate portion 42 and the cover 53.

As shown in FIG. 7, a plurality of control bus bars 27 are arranged on the back side of the main body 41. The control bus bars 27 are each supplied with a control current smaller than the current flowing through the bus bars 20A to 20D, and are respectively connected to the control terminals 16 of the relays 11A and 11B, the precharge relay 18, the precharge resistor 19, and the like. The housing of the control connector 66 is attached to the front end portion of the main body 41, and the connector terminal of the control connector 66 is electrically connected to the control bus bars 27. In the peripheral portion of the main body 41, a notch 51 is formed, into which a fastening portion 52 for screwing and fixing the base member 40 to the vehicle or the like can be inserted.

The dissipation of the heat generated from the relays 11A and 11B will be described.

The terminals 15A and 15B generate heat due to energization of the contact portions 13 of the relays 11A and 11B. The heat of the terminals 15A and 15B is transmitted from the terminals 15A and 15B to the heat dissipation members 30A and 30B, and is dissipated from the heat dissipation members 30A and 30B. Here, because the fan 35 is driven, as shown in FIG. 2, the receiving portions 33 of the heat dissipation members 30A and 30B receive air flow A1 from the fan 35, and the heat dissipation of the heat dissipation members 30A and 30B is promoted. Also, the movement of air passing through the paths A2 and A3 is promoted by the driving of the fan 35, and air flowing upward through the ventilation plate portion 44 promotes the dissipation of heat from the receiving portions 33 of the heat dissipation members 30A and 30B.

According to the above-mentioned embodiment, the following actions and effects are produced.

The relay unit 10 includes: the bus bars 20A to 20D serving as the conductive paths; the relays 11A and 11B including contact portions 13 for turning on and off energization of the bus bars 20A to 20D, and a plurality of terminals 15A and 15B connected to the contact portions 13, the bus bars 20A to 20D being fixed to the terminals 15A and 15B; and the heat dissipation members 30A and 30B that are fixed to the terminals 15A and 15B of the relays 11A and 11B, receive heat of the terminals 15A and 15B, and dissipate the heat.

According to the present embodiment, because the heat dissipation members 30A and 30B are fixed to the terminals 15A and 15B of the relays 11A and 11B, the heat dissipation members 30A and 30B can receive the heat of the terminals 15A and 15B and dissipate the heat from the heat dissipation members 30A and 30B to the outside. This makes it possible to improve the dissipation of the heat of the relays 11A and 11B.

The relay unit 10 includes: the plurality of relays 11A and 11B; the plurality of heat dissipation members 30A and 30B; and the fan 35, wherein the plurality of heat dissipation members 30A and 30B are disposed in the air flow path of the fan 35.

In this manner, the heat dissipation of the heat dissipation members 30A and 30B can be promoted by the air blowing from the fan 35.

The bus bars 20A to 20D and the heat dissipation members 30A and 30B overlap each other, and the heat dissipation members 30A and 30B are disposed on the side opposite to the relays 11A and 11B with respect to the bus bars 20A to 20D.

In this manner, the degree of freedom of the shapes of the heat dissipation members 30A and 30B can be increased as compared with the configuration in which the heat dissipation members 30A and 30B are disposed on the side of the relays 11A and 11B with respect to the bus bars 20A to 20D. Accordingly, it is easy to improve heat dissipation.

The relay unit 10 includes a fuse 28 disposed in the conductive path, and a partition wall 49 partitioning the heat dissipation members 30A and 30B and the fuse 28 from each other.

With this configuration, transfer of heat from the heat dissipation members 30A and 30B to the fuse 28 is suppressed by the partition wall 49. Accordingly, it is possible to suppress the influence that the heat from the heat dissipation members 30A and 30B has on the operation of the fuse 28.

The relay unit 10 includes the plurality of relays 11A and 11B, the plurality of heat dissipation members 30A and 30B, the fan 35, and the base member 40 on which the plurality of relays 11A and 11B are mounted, wherein the ventilation hole 45 is formed through the bottom plate portion 42 of the base member 40 on which the fan 35 is disposed.

With this configuration, when air passes through the ventilation hole 45 when the fan 35 blows, the cooling efficiency of the heat dissipation members 30A and 30B can be enhanced.

The fan 35 is disposed so as to be able to blow air in a direction along the bottom plate portion 42, and the plurality of heat dissipation members 30A and 30B are disposed in the air flow paths on both sides of the fan 35.

In this manner, the heat of the heat dissipation members 30A and 30B can be dissipated efficiently by the fan 35.

Second Embodiment

Next, a second embodiment will be described with reference to FIGS. 12 to 19. The fan 35 of the first embodiment is configured to be placed vertically on the bottom plate portion 42 of the base member 40 by the fixing member 38. On the other hand, in a fan 35 of the second embodiment, the fixing member 38 is not attached, and the fan 35 is placed horizontally on the bottom plate portion 81 and directly fixed to the bottom plate portion 81. In the following, the same components as those of the first embodiment are denoted by the same reference numerals, and the description thereof is omitted.

Relay Unit 70

Figure 12:
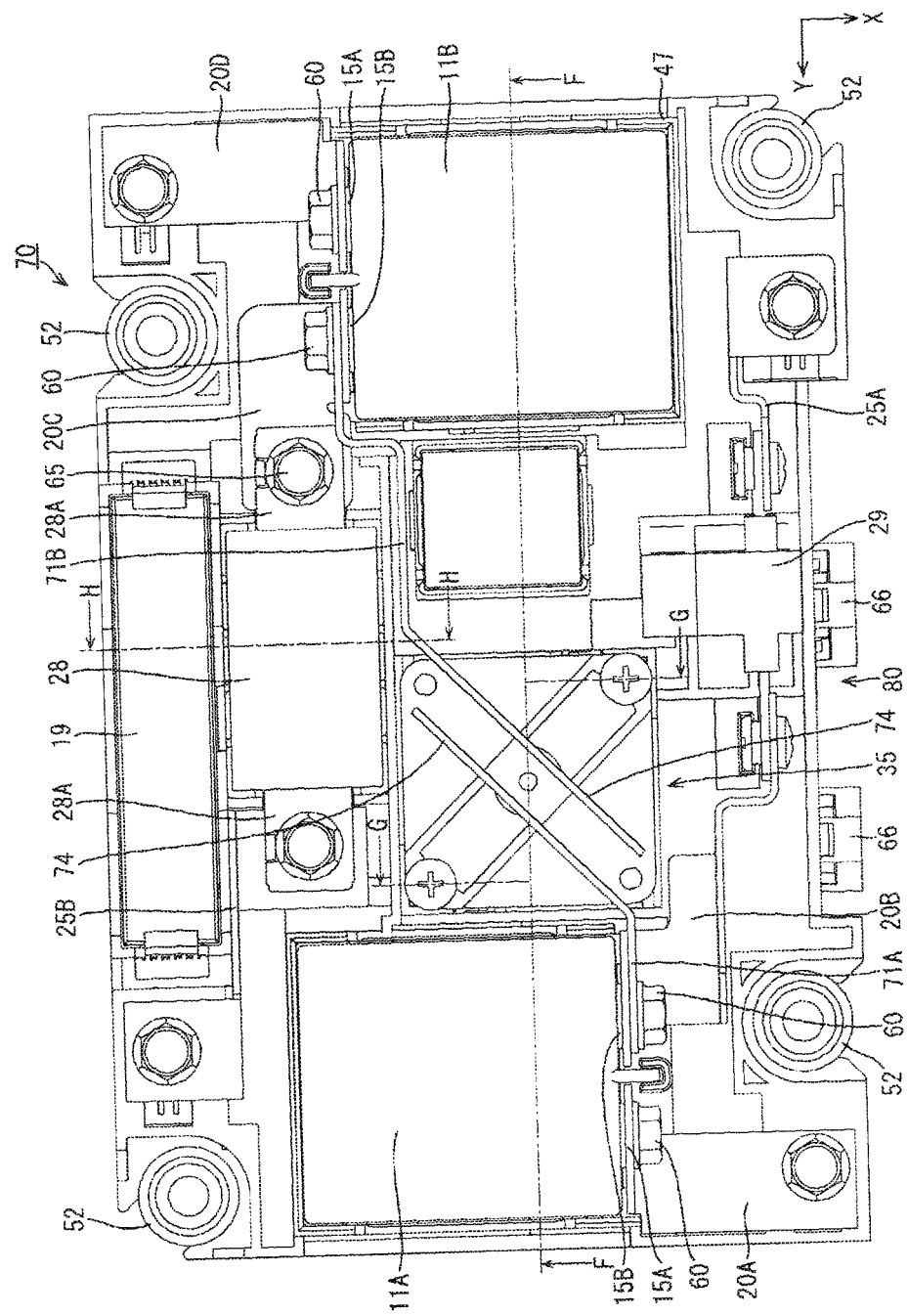
FIG. 12 is a plan view showing a relay unit of a second embodiment.

As shown in FIG. 12, a relay unit 70 includes: the relays 11A and 11B; the plurality of bus bars 20A to 20D serving as conductive paths; a plurality of heat dissipation members 71A and 71B fixed to the respective relays 11A and 11B to dissipate heat of the relays 11A and 11B; a fan 35 that blows air to the plurality of heat dissipation members 71A and 71B; and a base member 80 on which the plurality of bus bars 20A to 20D, the plurality of relays 11A and 11B, the heat dissipation members 71A and 71B, and the fan 35 are mounted.

Heat Dissipation Members 71A and 71B

Figure 18:
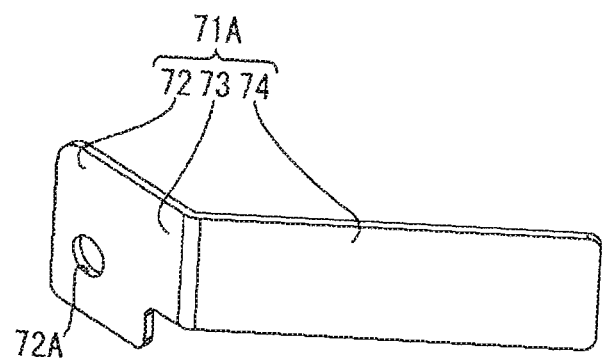
FIG. 18 is a perspective view showing one heat dissipation member.
Figure 19:
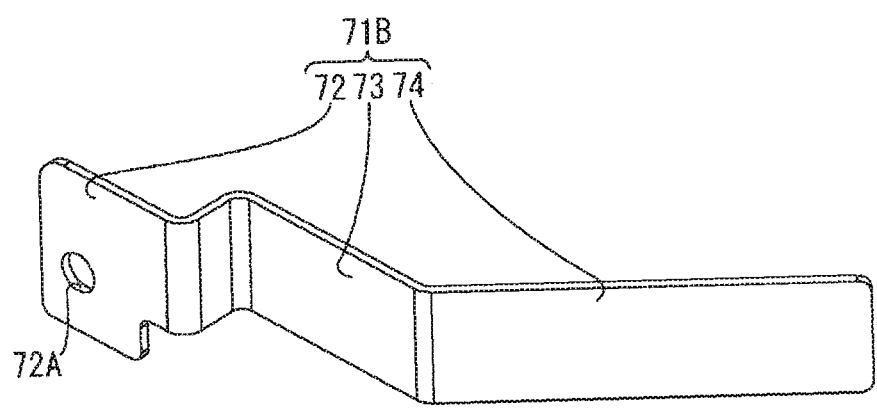
FIG. 19 is a perspective view showing another heat dissipation member.

The heat dissipation members 71A and 71B are made of a member such as metal having high thermal conductivity such as copper, a copper alloy, aluminum, an aluminum alloy, or the like, and are flat. As shown in FIGS. 18 and 19, the heat dissipation members 71A and 71B include: terminal connection portions 72 respectively connected to the terminals 15A and 15B; receiving portions 74 that are disposed in the air flow path of the fan 35 and receive air from the fan 35; and connection portions 73 connecting the terminal connection portions 72 and the receiving portions 74.

Each terminal connection portion 72 is provided with a through hole 72A through which the shaft portion 61 of the bolt 60 serving as a fastening member is inserted. A portion between the terminal connection portion 72 and the receiving portion 74 is bent in accordance with a path from the terminals 15A and 15B to the air flow path of the fan 35. The plate surface of the receiving portion 74 extends in a direction inclined with respect to the plate surface of the terminal connection portion 72.

Base Member 80

Figure 13:
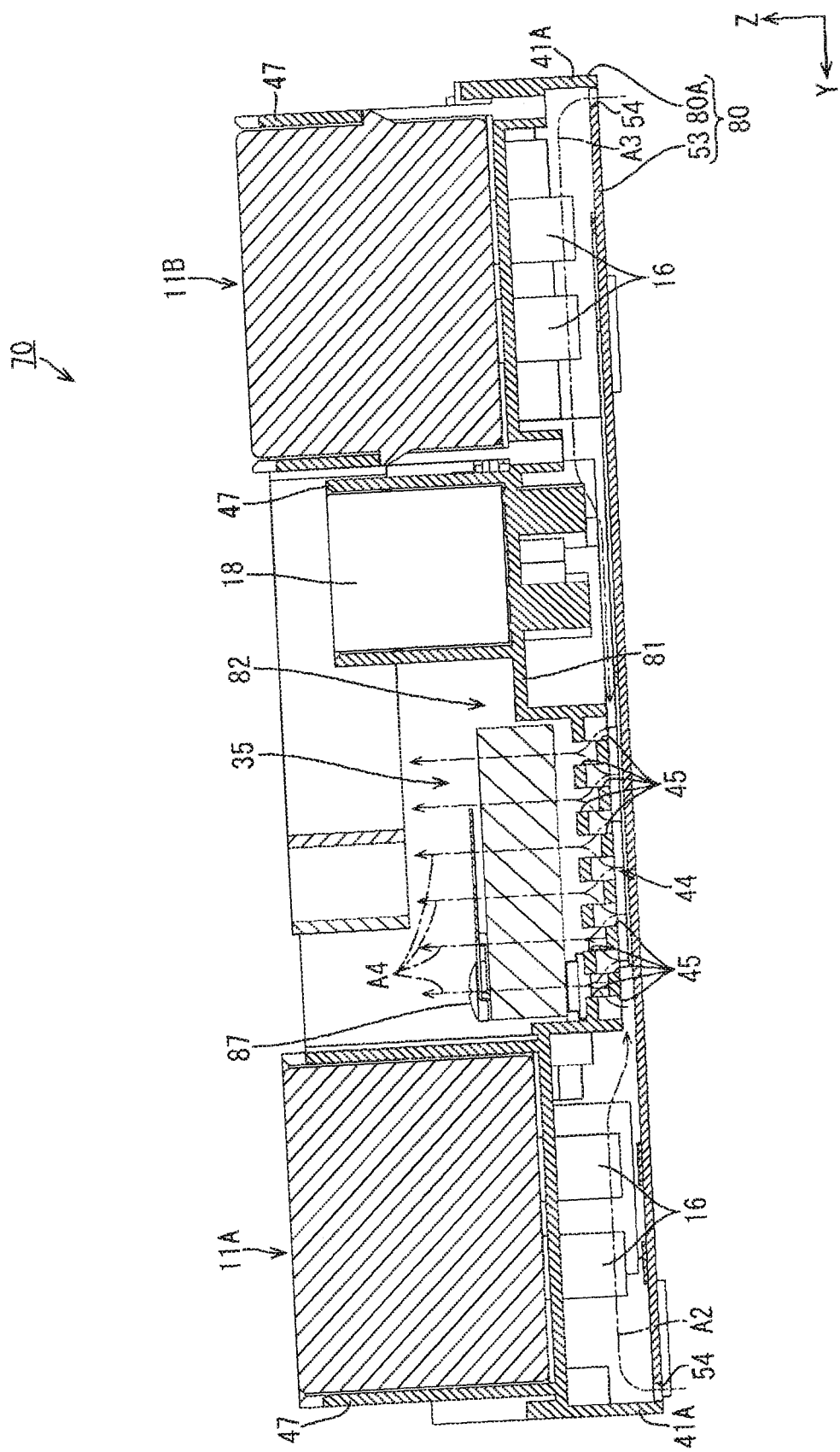
FIG. 13 is a cross-sectional view taken along line F-F of FIG. 12.
Figure 14:
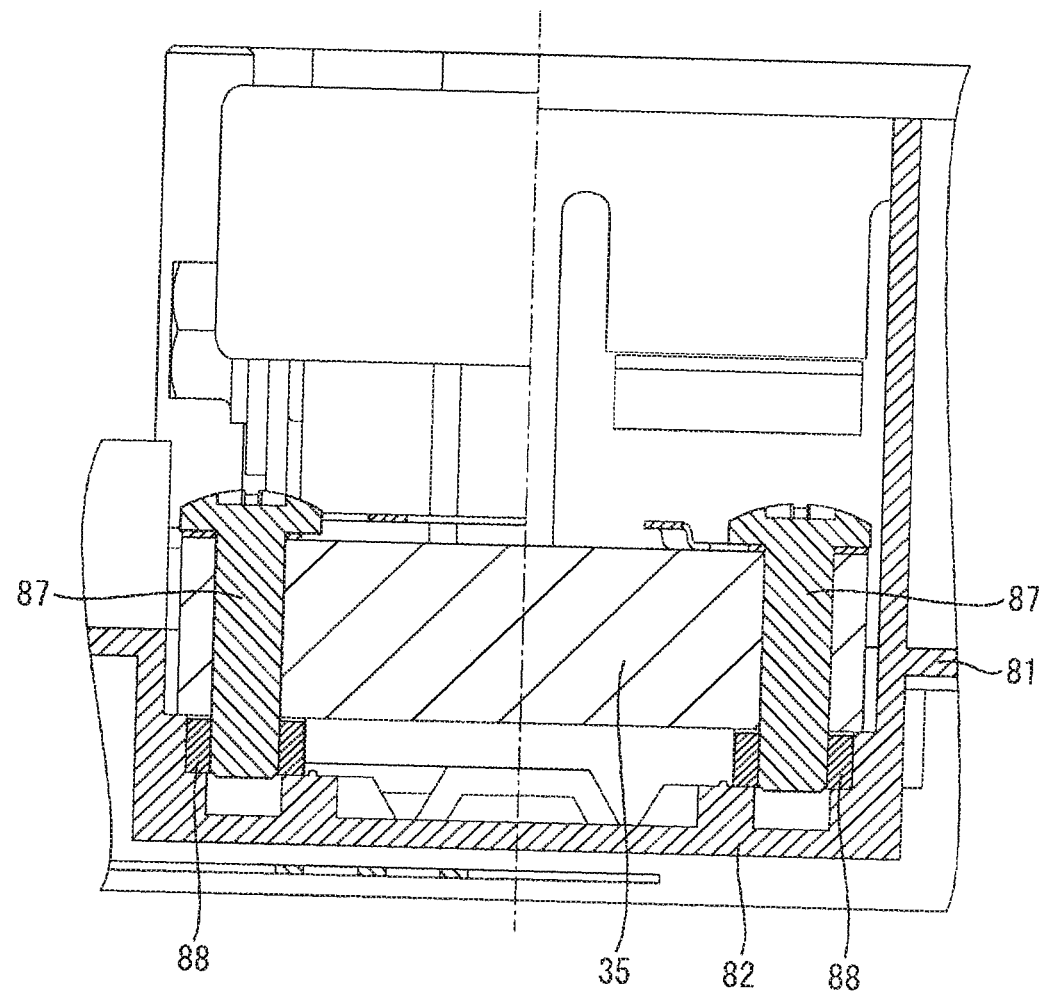
FIG. 14 is a cross-sectional view taken along line G-G of FIG. 12.
Figure 15:
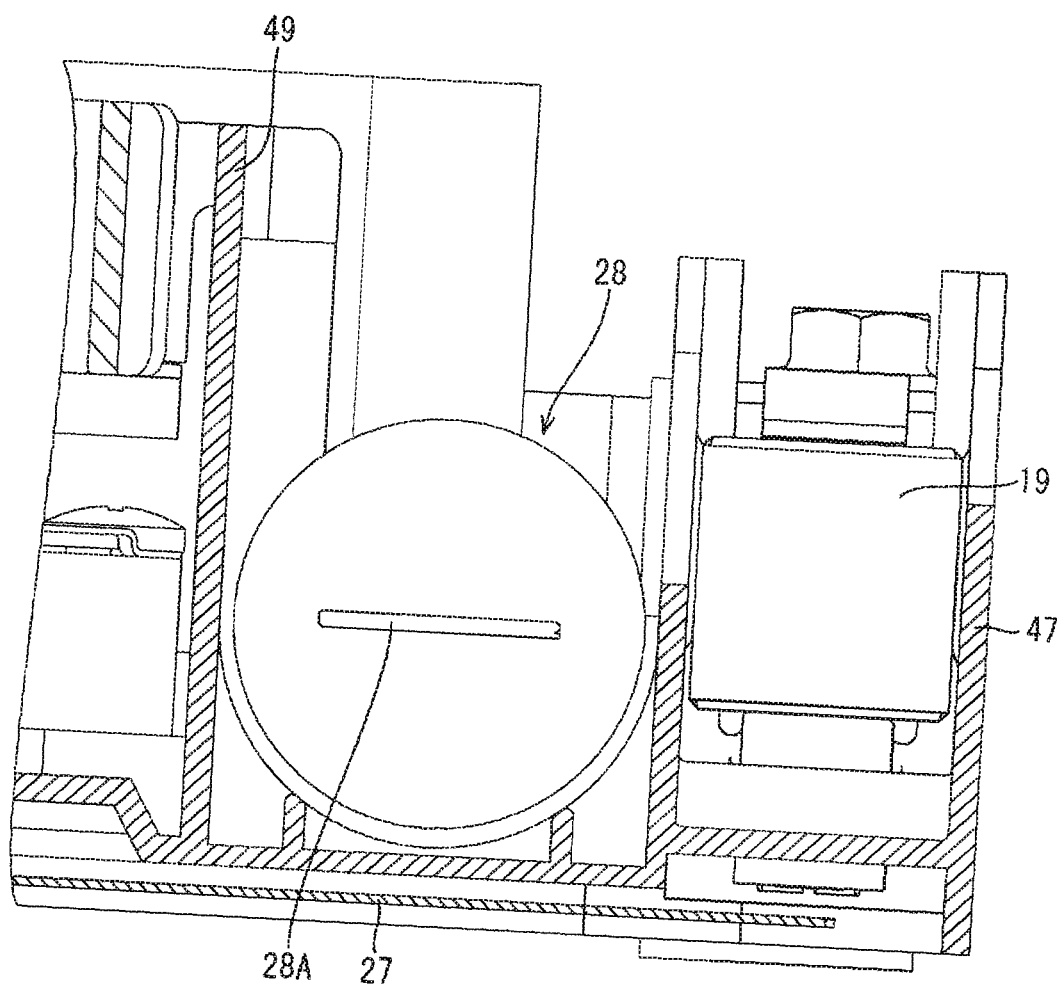
FIG. 15 is a cross-sectional view taken along line H-H of FIG. 12.
Figure 16:
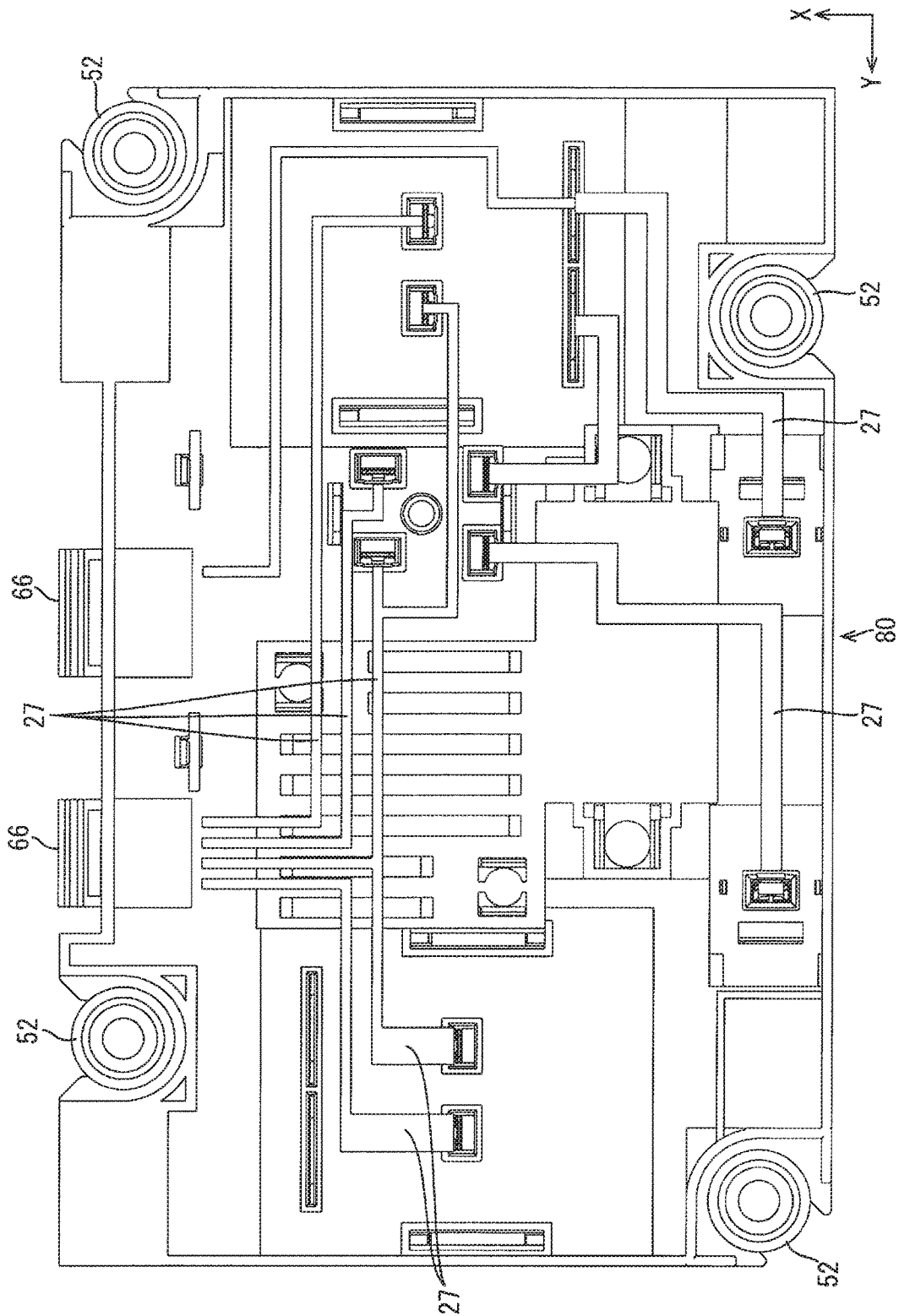
FIG. 16 is a diagram showing a state in which a control bus bar is arranged on the back surface side of a main body of a base member.
Figure 17:
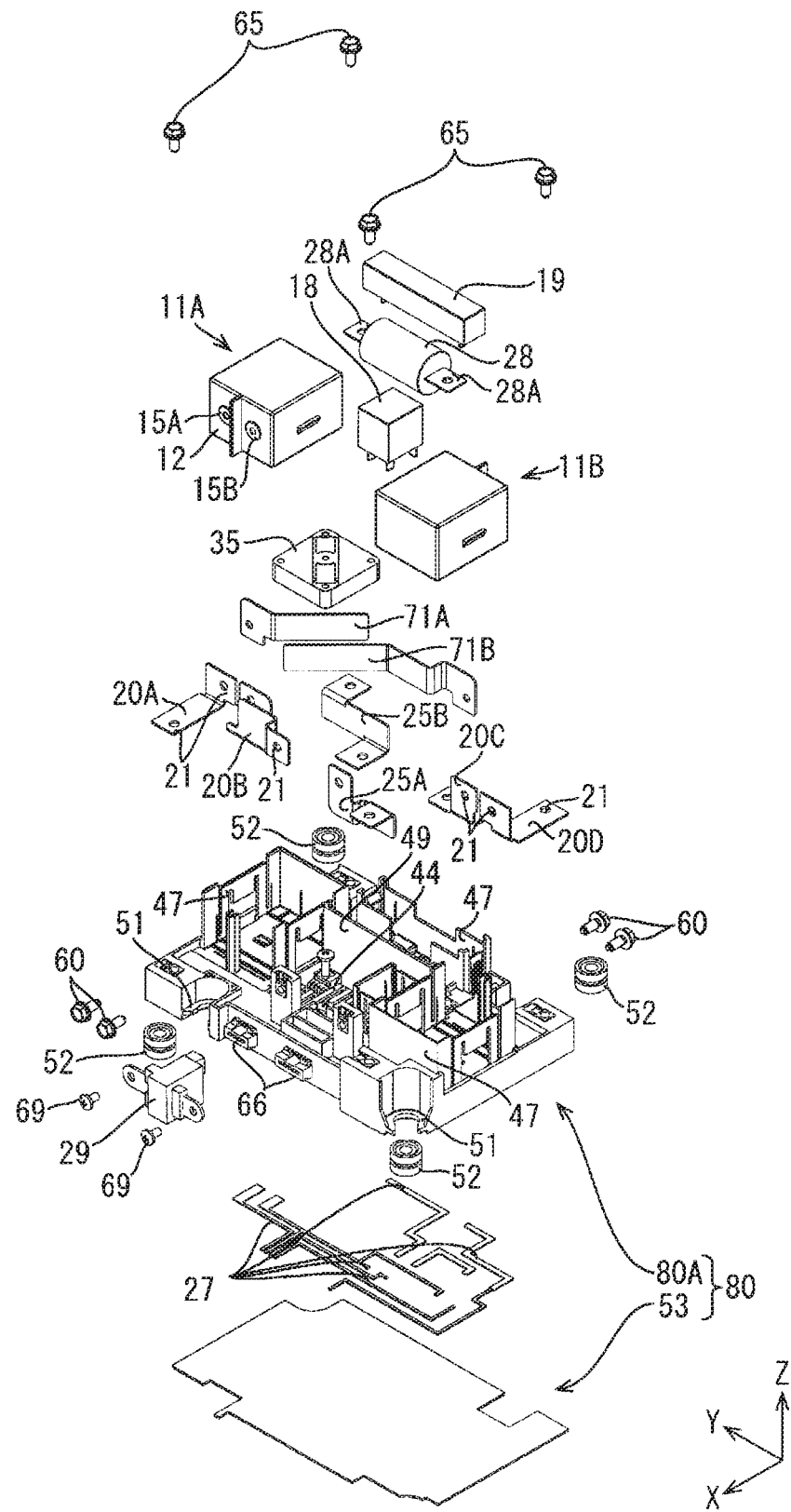
FIG. 17 is an exploded perspective view of the relay unit.

As shown in FIGS. 13 and 14, the bottom plate portion 81 of the main body 80A of the base member 80 is provided with a fan mounting portion 82 on which the fan 35 is mounted horizontally, at a position between the relays 11A and 11B. A pair of nuts 88 is fixed to the fan mounting portion 82 at diagonal positions, and the fan 35 is fixed to the fan mounting portion 82 by fastening the bolts 87 and the nuts 88. Then, air is blown from upward from below the fan 35 due to the driving of the fan 35 (the air flow path A4 in FIG. 13). The bottom plate portion 81 below the fan 35 is provided with a plate-shaped ventilation plate portion 44 including slit-like ventilation holes 45 in two upper and lower stages.

According to the second embodiment, the fan 35 is disposed so as to be able to blow air in the direction orthogonal to the bottom plate portion 81.

In this manner, air blown by the fan 35 can easily pass through the ventilation plate portion 44 of the base member 40, and therefore the cooling efficiency of the heat dissipation members 30A and 30B can be enhanced.

Other Embodiments

The technique described in the present specification is not limited to the embodiments described above with reference to the drawings, and, for example, the following embodiments are also included in the technical scope of the technique described in the present specification.

(1) In the above embodiment, the relay unit 10 is provided with one fan 35. However, a plurality of fans 35 may also be provided. Also, the relay unit 10 may not include the fan 35, and may also be configured so that heat is naturally dissipated from the heat dissipation members 30A, 30B, 71A, and 71B.

(2) The relay unit 10 includes a pair of (two) relays 11A and 11B and the heat dissipation members 30A and 30B, but the present invention is not limited to this. A different number of relays and a different number of heat dissipation members may also be included. For example, the relay unit may also be configured to include one relay and one heat dissipation member.

(3) The heat dissipation members 30A, 30B, 71A, and 71B are disposed on the side opposite to the relays 11A and 11B with respect to the bus bars 20A to 20D, but the present invention is not limited to this. The heat dissipation members 30A, 30B, 71A, and 71B may also be disposed on the side of the relays 11A and 11B with respect to the bus bars 20A to 20D.

(4) The heat dissipation members 30A, 30B, 71A, and 71B are flat, but the present invention is not limited to this. The heat dissipation members may also be, for example, rod-shaped.

(5) The terminals 15A and 15B are in the form of nuts and are fastened by the bolts 60, but the present invention is not limited to this. The terminals may also be in the form of bolts, and may also be fastened by nuts serving as fastening members. Furthermore, the present invention is not limited to the configuration in which the terminals are fastened by the fastening members, and, for example, the terminals may also be fixed to the bus bars and the heat dissipation members through welding.

LIST OF REFERENCE NUMERALS 10, 70 Relay unit
11A, 11B Relay
12 Resin case
13 Contact portion
14 Coil portion
15A, 15B Terminal
20A to 20D Bus bar
28 Fuse
30A, 30B, 71A, 71B Heat dissipation member
33,74 Receiving portion
35 Fan
40, 80 Base member
41, 80A Main body
42, 81 Bottom plate portion
43, 82 Fan mounting portion
44 Ventilation plate portion
45 Ventilation hole
49 Partition wall
60 Bolt

The invention claimed is:

1. A relay unit comprising:
bus bars serving as conductive paths;
a relay including a contact portion for turning on and off energization of the bus bars and a plurality of terminals connected to the contact portion, the bus bars being fixed to the plurality of terminals;
a heat dissipation member that is fixed to a terminal among the plurality of terminals of the relay, and is configured to receive heat of the terminal and dissipate the heat;
a fuse disposed in the conductive path; and
a partition wall partitioning the heat dissipation member and the fuse from each other.

2. The relay unit according to claim 1, wherein:
the relay comprises a plurality of relays,
the heat dissipation member comprises a plurality of heat dissipation members,
the relay unit further comprises a fan, and
the plurality of heat dissipation members are disposed in an air flow path of the fan.

3. The relay unit according to claim 1,
wherein the heat dissipation member overlaps a bus bar, and
the heat dissipation member is disposed on the side opposite to the relay with respect to the bus bar.

4. A relay unit comprising:
bus bars serving as conductive paths;
a relay including a contact portion for turning on and off energization of the bus bars and a plurality of terminals connected to the contact portion, the bus bars being fixed to the plurality of terminals; and
a heat dissipation member that is fixed to a terminal among the plurality of terminals of the relay, and is configured to receive heat of the terminal and dissipate the heat,
wherein the relay comprises a plurality of relays,
the heat dissipation member comprises a plurality of heat dissipation members,
the relay unit further comprises a fan, and a base member on which the plurality of relays are mounted, and
a ventilation hole is provided through a bottom plate portion of the base member on which the fan is disposed.

5. The relay unit according to claim 4, further comprising:
a fuse disposed in the conductive path; and
a partition wall partitioning the plurality of heat dissipation members and the fuse from each other.

6. The relay unit according to claim 4,
wherein the fan is disposed so as to be able to blow air in a direction along the bottom plate portion, and the plurality of heat dissipation members are disposed in air flow paths on both sides of the fan.

7. The relay unit according to claim 4,
wherein the fan is disposed to be able to blow air in a direction orthogonal to the bottom plate portion.

* * * * *